US011550684B2

(12) United States Patent
Srivastava et al.

(10) Patent No.: US 11,550,684 B2
(45) Date of Patent: Jan. 10, 2023

(54) TESTING OF LOCKSTEP ARCHITECTURE IN SYSTEM-ON-CHIPS

(71) Applicant: NXP B.V., Eindhoven (NL)

(72) Inventors: Neha Srivastava, New Delhi (IN); Krishan Bansal, Chandigarh (IN)

(73) Assignee: NXP B.V., Eindhoven (NL)

( * ) Notice: Subject to any disclaimer, the term of this patent is extended or adjusted under 35 U.S.C. 154(b) by 108 days.

(21) Appl. No.: 17/301,927

(22) Filed: Apr. 19, 2021

(65) Prior Publication Data

US 2022/0334936 A1    Oct. 20, 2022

(51) Int. Cl.
  G06F 11/07    (2006.01)
  G06F 11/30    (2006.01)
  G06F 11/263    (2006.01)
  G06F 9/52    (2006.01)

(52) U.S. Cl.
  CPC ............ *G06F 11/263* (2013.01); *G06F 9/52* (2013.01)

(58) Field of Classification Search
  CPC ................................ G06F 11/263; G06F 9/52
  See application file for complete search history.

(56) References Cited

U.S. PATENT DOCUMENTS

| 8,156,371 B2 | 4/2012 | Oliver et al. |
| 10,725,873 B2 | 7/2020 | Meriac et al. |
| 10,802,932 B2 | 10/2020 | Refaeli et al. |
| 10,831,628 B2 | 11/2020 | Santoni et al. |
| 2004/0078650 A1 | 4/2004 | Safford et al. |
| 2018/0059180 A1 | 3/2018 | Rangachari et al. |
| 2019/0012242 A1* | 1/2019 | Ozer ................... G06F 11/1629 |
| 2019/0114243 A1 | 4/2019 | Santoni ............... G06F 11/1633 |
| 2020/0319984 A1* | 10/2020 | Bryant ................ G06F 11/2035 |
| 2022/0209759 A1 | 6/2022 | Srivastava et al. |

OTHER PUBLICATIONS

A. Floridia and E. Sanchez, "Hybrid On-Line Self-Test Strategy for Dual-Core Lockstep Processors", 2018 IEEE International Symposium on Defect and Fault Tolerance in VLSI and Nanotechnology Systems (DFT), Jan. 7, 2019, IEEE, Chicago, IL, USA.
Yusuke Kanno, Tadanobu Toba, Kotaro Shimamura, and Nobuyasu Kanekawa, "Design Method for Online Totally Self-Checking Comparators Implementable on FPGAs", IEEE Transactions on Very Large Scale Integration (VLSI) Systems, Jan. 9, 2020, pp. 726-735, vol. 28, Issue. 3, IEEE.
U.S. Appl. No. 17/247,949, filed Dec. 31, 2020 entitled: Clock Sweeping System. The Examiner is referred to the copending patent prosecution of the common Applicant (no attachment).

* cited by examiner

*Primary Examiner* — Matthew M Kim
*Assistant Examiner* — Kyle Emanuele

(57) ABSTRACT

A lockstep testing system includes a lockstep controller that generates various control signals. The lockstep testing system further includes various lockstep circuitries, with each lockstep circuitry including primary and redundant functional circuits that are operable in a lockstep mode, and a fault injection circuit that receives a control signal from the lockstep controller and injects a transient fault in the corresponding lockstep circuitry. The transient fault can be injected at one of input and output stages of the primary and redundant functional circuits. Each lockstep circuitry further includes a checker circuit that tests whether the corresponding lockstep circuitry is faulty (i.e., whether the injected fault is accurately detected), and generates and provides, to the lockstep controller, a fault indication signal indicating whether the corresponding lockstep circuitry is faulty.

20 Claims, 3 Drawing Sheets

TESTING OF LOCKSTEP ARCHITECTURE IN SYSTEM-ON-CHIPS

BACKGROUND

The present disclosure relates generally to electronic circuits, and, more particularly, to testing of a lockstep architecture in system-on-chips (SoCs).

An SoC includes various functional circuits (e.g., direct memory access controllers, processors, or the like) that generate critical data. Such critical data, if corrupted, compromises assets and/or security of the SoC. To protect the critical data against corruption, a lockstep architecture is implemented in the SoC, where a redundant functional circuit is utilized in conjunction with a primary functional circuit such that the primary and redundant functional circuits are operable in a lockstep mode. In such a scenario, an input to the redundant functional circuit is a delayed version of an input to the primary functional circuit. Further, first critical data generated by the primary functional circuit is then delayed by a same value with which the input to the redundant functional circuit is delayed. The delayed first critical data is then compared with second critical data generated by the redundant functional circuit to generate a fault indication signal.

To test whether the lockstep architecture is operating in a desired manner (i.e., is capable of detecting a mismatch between the delayed first critical data and the second critical data), a fault is injected in the lockstep architecture (e.g., in the first or second critical data). Typically, the fault is injected by altering a code associated with the primary or redundant functional circuit. However, such a testing technique results in one or both of the primary and redundant functional circuits operating in an uncontrolled manner. Further, the fault that is injected is a static fault. The functional circuits, however, typically experience various transient faults (e.g., common cause failures) during an operation of the SoC. Thus, a degree of testing of the lockstep architecture is limited which leads to a degradation in a reliability of the testing technique. The reliability of the testing technique further degrades when the primary or redundant functional circuit operates in a metastable state. Therefore, there exists a need for a technical solution that solves the aforementioned problems of existing techniques of testing a lockstep architecture in SoCs.

SUMMARY

In an embodiment of the present disclosure, a lockstep testing system is disclosed. The lockstep testing system can include a lockstep controller configured to generate a first control signal, and plurality of lockstep circuitries that can be coupled with the lockstep controller. First lockstep circuitry of the plurality of lockstep circuitries can include a plurality of functional circuits, a fault injection circuit, and a checker circuit. The plurality of functional circuits can be configured to receive first and second reference data and generate first and second output data. The fault injection circuit can be coupled with the lockstep controller and the plurality of functional circuits, and configured to receive the first control signal and the first and second output data, and generate first and second fault data. The checker circuit can be coupled with the fault injection circuit, and configured to receive the first and second fault data and test whether the first lockstep circuitry is faulty based on the first and second fault data. The checker circuit can be further coupled with the lockstep controller, and configured to generate and provide, to the lockstep controller, a fault indication signal that indicates whether the first lockstep circuitry is faulty.

In some embodiments, the first lockstep circuitry can further include a first delay circuit that can be configured to receive the first reference data and generate the second reference data such that the second reference data is a delayed version of the first reference data.

In some embodiments, the fault injection circuit can include an edge detector, a pulse generator, and first and second fault controllers. The edge detector can be coupled with the lockstep controller, and configured to receive the first control signal and generate an edge signal. The edge signal can be indicative of one of positive and negative edges of the first control signal. The pulse generator can be coupled with the edge detector, and configured to receive the edge signal and a first clock signal, and generate a pulse signal. The first and second fault controllers can be coupled with first and second functional circuits of the plurality of functional circuit, and configured to receive the first and second output data, respectively. The first and second fault controllers can be further coupled with the pulse generator, and further configured to receive the pulse signal. The first fault controller can be further configured to generate the first fault data based on the first output data and the pulse signal. Similarly, the second fault controller can be further configured to generate the second fault data based on the second output data and the pulse signal.

In some embodiments, the first lockstep circuitry can further include a clock sweeping circuit that can be coupled with the first and second functional circuits and the pulse generator. The clock sweeping circuit can be configured to receive the first reference data and a second clock signal, sweep the second clock signal with respect to the first reference data to generate the first clock signal, and provide the first clock signal to the first and second functional circuits and the pulse generator. The first and second functional circuits can further generate the first and second output data, respectively, based on the first clock signal.

In some embodiments, to generate the first and second fault data, the first and second fault controllers can be further configured to inject, based on the pulse signal in a one-hot manner, a transient fault in the first and second output data, respectively.

In some embodiments, the first and second fault controllers can be further coupled with the lockstep controller, and configured to generate first and second status data that indicate whether the first and second functional circuits operate in a metastable state while the first lockstep circuitry is being tested, respectively. The first and second fault controllers can be further configured to provide the first and second status data to the lockstep controller, respectively. The lockstep controller can be further configured to initiate a diagnosis of the first lockstep circuitry based on the first and second status data and the fault indication signal.

In some embodiments, the checker circuit can include first and second encoders and a second delay circuit. The first encoder can be coupled with the fault injection circuit, and configured to receive the first fault data and generate first encoded data. The second delay circuit can be coupled with the first encoder, and configured to receive the first encoded data and generate second encoded data such that the second encoded data is a delayed version of the first encoded data. The second encoder can be coupled with the fault injection circuit, and configured to receive the second fault data and generate third encoded data.

In some embodiments, the checker circuit can further include a comparator that can be coupled with the second delay circuit and the second encoder, and configured to receive the second and third encoded data, respectively. The comparator can be further configured to test whether the first lockstep circuitry is faulty by comparing the second and third encoded data, and generate the fault indication signal based on a result of the comparison of the second and third encoded data. The fault indication signal is deactivated when the second and third encoded data match, and activated when the second and third encoded data do not match. The comparator can be further coupled with the lockstep controller, and further configured to provide the fault indication signal to the lockstep controller.

In some embodiments, the comparator can be further configured to generate third status data indicative of one or more bits associated with the second and third encoded data that is faulty, and provide the third status data to the lockstep controller. The lockstep controller can be further configured to initiate a diagnosis of the first lockstep circuitry based on the third status data and the fault indication signal.

In some embodiments, the lockstep testing system can further include a fault management circuit that can be coupled with the checker circuit, and configured to receive the fault indication signal and execute a recovery operation associated with the first lockstep circuitry.

In some embodiments, the plurality of functional circuits include first and second functional circuits that are operable in a lockstep mode, and configured to generate the first and second output data, respectively. The lockstep controller can be further configured to generate a masking signal to facilitate masking of the first output data from the first functional circuit to a third functional circuit while the first lockstep circuitry is being tested.

In some embodiments, the fault injection circuit can be further configured to receive the fault indication signal and update, based on the fault indication signal, the first and second fault data to facilitate the testing of the first lockstep circuitry in a continuous manner.

In another embodiment of the present disclosure, a system-on-chip (SoC) is disclosed. The SoC can include a first functional circuit that can be configured to generate first reference data, and a lockstep testing system that can be coupled with the first functional circuit. The lockstep testing system can include a lockstep controller that can be configured to generate a first control signal, and plurality of lockstep circuitries that can be coupled with the lockstep controller and the first functional circuit. First lockstep circuitry of the plurality of lockstep circuitries can include a plurality of functional circuits, a fault injection circuit, and a checker circuit. The plurality of functional circuits can be configured to receive the first reference data and second reference data, and generate first and second output data. The fault injection circuit can be coupled with the lockstep controller and the plurality of functional circuits, and configured to receive the first control signal and the first and second output data, and generate first and second fault data. The checker circuit can be coupled with the fault injection circuit, and configured to receive the first and second fault data and test whether the first lockstep circuitry is faulty based on the first and second fault data. The checker circuit can be further coupled with the lockstep controller, and configured to generate and provide, to the lockstep controller, a fault indication signal that indicates whether the first lockstep circuitry is faulty.

In yet another embodiment of the present disclosure, a lockstep testing system is disclosed. The lockstep testing system can include a lockstep controller that can be configured to generate a first control signal, and plurality of lockstep circuitries that can be coupled with the lockstep controller. First lockstep circuitry of the plurality of lockstep circuitries can include a fault injection circuit, a plurality of functional circuits, and a checker circuit. The fault injection circuit can be coupled with the lockstep controller, and configured to receive the first control signal and first and second reference data, and generate first and second fault data. The plurality of functional circuits can be coupled with the fault injection circuit, and configured to receive the first and second fault data and generate first and second output data. The checker circuit can be coupled with the plurality of functional circuits, and configured to receive the first and second output data and test whether the first lockstep circuitry is faulty based on the first and second output data. The checker circuit can be further coupled with the lockstep controller, and configured to generate and provide, to the lockstep controller, a fault indication signal that indicates whether the first lockstep circuitry is faulty.

In some embodiments, the first lockstep circuitry can further include a first delay circuit that can be configured to receive the first reference data and generate the second reference data such that the second reference data is a delayed version of the first reference data.

In some embodiments, the fault injection circuit can include an edge detector, a pulse generator, and first and second fault controllers. The edge detector can be coupled with the lockstep controller, and configured to receive the first control signal and generate an edge signal. The edge signal can be indicative of one of positive and negative edges of the first control signal. The pulse generator can be coupled with the edge detector, and configured to receive the edge signal and a first clock signal, and generate a pulse signal. The first and second fault controllers can be configured to receive the first and second reference data, respectively. The first and second fault controllers can be coupled with the pulse generator, and further configured to receive the pulse signal. The first fault controller can be further configured to generate the first fault data based on the first reference data and the pulse signal. Similarly, the second fault controller can be further configured to generate the second fault data based on the second reference data and the pulse signal.

In some embodiments, the first lockstep circuitry can further include a clock sweeping circuit that can be coupled with first and second functional circuits of the plurality of functional circuits and the pulse generator. The clock sweeping circuit can be configured to receive the first reference data and a second clock signal, sweep the second clock signal with respect to the first reference data to generate the first clock signal, and provide the first clock signal to the first and second functional circuits and the pulse generator. The first and second functional circuits can further generate the first and second output data, respectively, based on the first clock signal.

In some embodiments, the checker circuit can include first and second encoders, a second delay circuit, and a comparator. The first encoder can be coupled with the first functional circuit, and configured to receive the first output data and generate first encoded data. The second delay circuit can be coupled with the first encoder, and configured to receive the first encoded data and generate second encoded data such that the second encoded data is a delayed version of the first encoded data. The second encoder can be coupled with the second functional circuit, and configured to receive the second output data and generate third encoded data. The comparator can be coupled with the second delay circuit and the second encoder, and configured to receive the second and third encoded data, respectively, and test whether the first lockstep circuitry is faulty by comparing the second and third encoded data. The comparator can be further coupled with the lockstep controller, and configured to generate and provide, based on a result of the comparison of the second and third encoded data, the fault indication signal to the lockstep controller. The fault indication signal is deactivated when the second and third encoded data match, and activated when the second and third encoded data do not match.

Various embodiments of the present disclosure disclose a lockstep testing system. The lockstep testing system can include a lockstep controller configured to generate various control signals and various lockstep circuitries that can be coupled with the lockstep controller such that each lockstep circuitry can be configured to receive one control signal from the lockstep controller. Each lockstep circuitry can include various functional circuits that can be operable in a lockstep mode, and a fault injection circuit that can be configured to inject a transient fault in the corresponding lockstep circuitry. The fault injection circuit injects the transient fault based on the control signal received from the lockstep controller. The transient fault can be injected at one of input and output stages of the functional circuits. Each lockstep circuitry can further include a checker circuit that can be configured to test whether the corresponding lockstep circuitry is faulty (i.e., whether the injected fault is accurately detected), and generate a fault indication signal that indicates whether the corresponding lockstep circuitry is faulty.

Thus, the testing technique implemented by the lockstep testing system of the present disclosure is sans any alteration of codes associated with the functional circuits of the lockstep circuitry. As a result, a possibility of the functional circuits operating in an uncontrolled manner is significantly less as compared to that associated with a conventional testing technique that includes altering codes of a functional circuit in a lockstep architecture. Further, each lockstep circuitry is tested for various conditions (such as different faults that are injected in each lockstep circuitry). Hence, a degree of testing of the lockstep architecture facilitated by the testing technique of the present disclosure is significantly greater than that facilitated by the conventional testing technique. Further, the testing technique implemented by the lockstep testing system of the present disclosure includes injection of transient faults in each lockstep circuitry for testing the corresponding lockstep circuitry. Thus, a reliability of the testing technique implemented by the lockstep testing system of the present disclosure is significantly greater than that of the conventional testing technique that facilitates a limited degree of testing of the lockstep architecture and includes injection of static faults.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
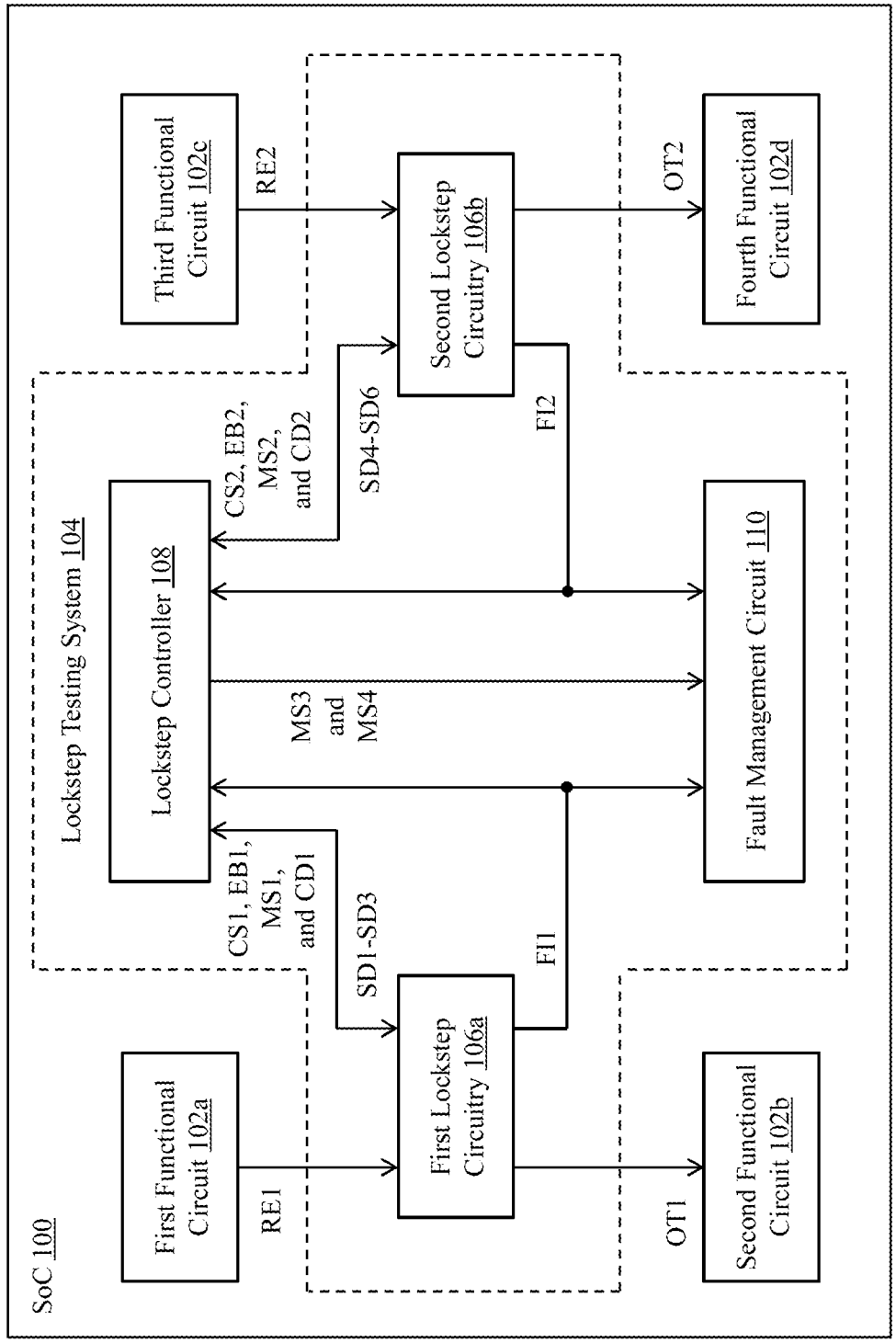
FIG. 1 illustrates a schematic block diagram of a system-on-chip (SoC) in accordance with an embodiment of the present disclosure.

FIG. 1 illustrates a schematic block diagram of a system-on-chip (SoC) 100 in accordance with an embodiment of the present disclosure. The SoC 100 can include a first plurality of functional circuits of which first through fourth functional circuits 102a-102d are shown. The SoC 100 can further include a lockstep testing system 104 that can be coupled with the first through fourth functional circuits 102a-102d. The lockstep testing system 104 can include plurality of lockstep circuitries of which first and second lockstep circuitries 106a and 106b are shown. The lockstep testing system 104 can further include a lockstep controller 108 and a fault management circuit 110. The SoC 100 can be utilized in an automotive application (e.g., an advanced driver assistance system), a consumer application (e.g., a home security system), a network device, a mobile device, or the like.

The first through fourth functional circuits 102a-102d can include suitable circuitry that can be configured to perform one or more operations. For example, the first functional circuit 102a can be configured to generate first reference data RE1. Further, the first functional circuit 102a can be coupled with the first lockstep circuitry 106a, and configured to provide the first reference data RE1 to the first lockstep circuitry 106a. The first reference data RE1 is utilized by the first lockstep circuitry 106a to generate first output data OT1. The first output data OT1 corresponds to critical data that enable the first lockstep circuitry 106a to control a first set of critical operations associated with the second functional circuit 102b. In an example, based on the first output data OT1, sensitive data associated with the second functional circuit 102b can be accessed by the first lockstep circuitry 106a. In other words, the second functional circuit 102b can be coupled with the first lockstep circuitry 106a, and configured to receive the first output data OT1 and execute the first set of critical operations associated therewith (e.g., provide the first lockstep circuitry 106a access to the associated sensitive data).

The third and fourth functional circuits 102c and 102d can similarly be coupled with the second lockstep circuitry 106b. The third functional circuit 102c can be configured to generate and provide second reference data RE2 to the second lockstep circuitry 106b. Further, the fourth functional circuit 102d can be configured to receive second output data OT2, and execute a second set of critical operations associated therewith based on the received second output data OT2. The second output data OT2 can be generated by the second lockstep circuitry 106b based on the second reference data RE2. Examples of the first through fourth functional circuits 102a-102d can include direct memory access (DMA) controllers, processors, or the like.

The lockstep testing system 104 can be coupled with the first and third functional circuits 102a and 102c, and configured to receive the first and second reference data RE1 and RE2 and generate the first and second output data OT1 and OT2, respectively. Further, the lockstep testing system 104 can be coupled with the second and fourth functional circuits 102b and 102d, and configured to provide the first and second output data OT1 and OT2 to the second and fourth functional circuits 102b and 102d, respectively. The lockstep testing system 104 can include the lockstep controller 108, the plurality of lockstep circuitries of which the first and second lockstep circuitries 106a and 106b are shown, and the fault management circuit 110.

Each lockstep circuitry (such as the first and second lockstep circuitries 106a and 106b) of the lockstep testing system 104 implements a lockstep architecture (i.e., includes a pair of functional circuits that are operable in a lockstep mode to prevent corruption of corresponding output data). The pair of functional circuits are functionally similar (i.e., the functional circuits execute same set of operations in parallel). Such redundancy facilitates detection of faults in the lockstep architecture. Thus, in addition to generating the first and second output data OT1 and OT2, the lockstep testing system 104 can be further configured to test whether any lockstep circuitry of the lockstep testing system 104 is faulty (i.e., is not accurately detecting faulty data). The testing of the first and second lockstep circuitries 106a and 106b includes injecting first and second faults therein and testing whether the first and second faults are detected in the first and second lockstep circuitries 106a and 106b, respectively. When the first and second faults are accurately detected, it is determined that the first and second lockstep circuitries 106a and 106b are operating in a desired manner, respectively. Conversely, when the first and second faults are not detected or detected inaccurately, it is determined that the first and second lockstep circuitries 106a and 106b are faulty, respectively. Further, the lockstep testing system 104 operates in adherence to requirements associated with failure modes, effects, and diagnostic analysis (FMEDA) technique.

The first lockstep circuitry 106a can be coupled with the first functional circuit 102a, and configured to receive the first reference data RE1 and generate the first output data OT1. The first lockstep circuitry 106a includes a second plurality of functional circuits of which fifth and sixth functional circuits are shown later in FIG. 2A. The fifth and sixth functional circuits are operable in the lockstep mode to prevent corruption of the first output data OT1. In such a scenario, the fifth functional circuit corresponds to a primary functional circuit and the sixth functional circuit corresponds to a redundant functional circuit that is functionally similar to the fifth functional circuit.

The first lockstep circuitry 106a can be further coupled with the lockstep controller 108, and configured to receive a first masking signal MS1. Further, the first lockstep circuitry 106a can be coupled with the second functional circuit 102b, and configured to provide, based on the first masking signal MS1, the first output data OT1 to the second functional circuit 102b. The first masking signal MS1 thus controls whether the first output data OT1 is provided to the second functional circuit 102b. In an embodiment, when the first masking signal MS1 is deactivated (i.e., is at a logic low state), the first output data OT1 is provided to the second functional circuit 102b. Further, when the first masking signal MS1 is activated (i.e., is at a logic high state), the first output data OT1 from the first lockstep circuitry 106a to the second functional circuit 102b is masked (i.e., the first output data OT1 is not provided to the second functional circuit 102b). The first masking signal MS1 can be generated such that the first masking signal MS1 is activated while the first lockstep circuitry 106a is being tested.

The first lockstep circuitry 106a can be further configured to receive a first control signal CS1, a first enable signal EB1, and first configuration data CD1 from the lockstep controller 108. The first control signal CS1 can be indicative of the first fault that is to be injected in the first lockstep circuitry 106a. In an embodiment, the first fault is a static fault. The first enable signal EB1 can control sweeping of one or more clock signals associated with the first lockstep circuitry 106a. The first configuration data CD1 can be indicative of a bit of the first output data OT1 or the first reference data RE1 that is to be flipped to inject the first fault therein, a manner (e.g., continuous or triggered) in which the first lockstep circuitry 106a is to be tested, or the like. Based on the first control signal CS1, the first enable signal EB1, and the first configuration data CD1, the first lockstep circuitry 106a can be configured to inject the first fault therein and test whether the injected first fault is accurately detected (i.e., whether the first lockstep circuitry 106a is faulty).

The first lockstep circuitry 106a can be further configured to generate first through third status data SD1-SD3 and first fault indication signal FI1 based on the testing thereof. The first fault indication signal FI1 can indicate whether the first lockstep circuitry 106a is faulty. In an embodiment, the first fault indication signal FI1 is activated (i.e., is at a logic high state) when the first lockstep circuitry 106a is operating in a desired manner. Further, the first fault indication signal FI1 is deactivated (i.e., is at a logic low state) when the first lockstep circuitry 106a is faulty. The first and second status data SD1 and SD2 can indicate whether the fifth and sixth functional circuits operate in a metastable state during the testing of the first lockstep circuitry 106a (i.e., while the first lockstep circuitry 106a is being tested), respectively. The third status data SD3 can be indicative of one or more faulty bits that are detected in the first lockstep circuitry 106a. The first lockstep circuitry 106a can be further configured to provide the first through third status data SD1-SD3 and the first fault indication signal FI1 to the lockstep controller 108 to facilitate a diagnosis of the first lockstep circuitry 106a. Further, the first lockstep circuitry 106a can be coupled with the fault management circuit 110, and configured to provide the first fault indication signal FI1 to the fault management circuit 110 to facilitate recovery of the first lockstep circuitry 106a. The first lockstep circuitry 106a is explained in detail in conjunction with FIGS. 2A and 2B.

The second lockstep circuitry 106b can be coupled with the third functional circuit 102c, and configured to receive the second reference data RE2 and generate the second output data OT2. The second lockstep circuitry 106b includes seventh and eighth functional circuits (not shown) that are operable in the lockstep mode to prevent corruption of the second output data OT2. In such a scenario, the seventh functional circuit corresponds to the primary functional circuit and the eighth functional circuit corresponds to the redundant functional circuit that is functionally similar to the seventh functional circuit.

The second lockstep circuitry 106b can be further coupled with the lockstep controller 108, and configured to receive a second masking signal MS2. Further, the second lockstep circuitry 106b can be coupled with the fourth functional circuit 102d, and configured to provide, based on the second masking signal MS2, the second output data OT2 to the fourth functional circuit 102d. In an embodiment, when the second masking signal MS2 is deactivated (i.e., is at a logic low state), the second output data OT2 is provided to the fourth functional circuit 102d. Further, when the second masking signal MS2 is activated (i.e., is at a logic high state), the second output data OT2 from the second lockstep circuitry 106*b* to the fourth functional circuit 102*d* is masked (i.e., the second output data OT2 is not provided to the fourth functional circuit 102*d*). The second masking signal MS2 can be generated such that the second masking signal MS2 is activated while the second lockstep circuitry 106*b* is being tested.

The second lockstep circuitry 106*b* can be further configured to receive a second control signal CS2, a second enable signal EB2, and second configuration data CD2 from the lockstep controller 108. The second control signal CS2 can be indicative of the second fault that is to be injected in the second lockstep circuitry 106*b*. In an embodiment, the second fault is a static fault. The second enable signal EB2 can control sweeping of one or more clock signals associated with the second lockstep circuitry 106*b*. The second configuration data CD2 can be indicative of a bit of the second output data OT2 or the second reference data RE2 that is to be flipped to inject the second fault therein, a manner (e.g., continuous or triggered) in which the second lockstep circuitry 106*b* is to be tested, or the like. Based on the second control signal CS2, the second enable signal EB2, and the second configuration data CD2, the second lockstep circuitry 106*b* can be configured to inject the second fault therein and test whether the injected second fault is accurately detected (i.e., whether the second lockstep circuitry 106*b* is faulty).

The second lockstep circuitry 106*b* can be further configured to generate fourth through sixth status data SD4-SD6 and a second fault indication signal FI2 based on the testing thereof. The second fault indication signal FI2 can indicate whether the second lockstep circuitry 106*b* is faulty. In an embodiment, the second fault indication signal FI2 is activated (i.e., is at a logic high state) when the second lockstep circuitry 106*b* is operating in a desired manner. Further, the second fault indication signal FI2 is deactivated (i.e., is at a logic low state) when the second lockstep circuitry 106*b* is faulty. The fourth and fifth status data SD4 and SD5 can indicate whether the seventh and eighth functional circuits operate in a metastable state while the second lockstep circuitry 106*b* is being tested, respectively. The sixth status data SD6 can be indicative of one or more faulty bits that are detected in the second lockstep circuitry 106*b*. The second lockstep circuitry 106*b* can be further configured to provide the fourth through sixth status data SD4-SD6 and the second fault indication signal FI2 to the lockstep controller 108 to facilitate a diagnosis of the second lockstep circuitry 106*b*. Further, the second lockstep circuitry 106*b* can be coupled with the fault management circuit 110, and configured to provide the second fault indication signal FI2 to the fault management circuit 110 to facilitate recovery of the second lockstep circuitry 106*b*. The second lockstep circuitry 106*b* is structurally similar to the first lockstep circuitry 106*a*.

Although FIG. 1 illustrates that the lockstep testing system 104 includes two lockstep circuitries (i.e., the first and second lockstep circuitries 106*a* and 106*b*), it will be apparent to a person skilled in the art that the scope of the present disclosure is not limited to it. In various other embodiments, the lockstep testing system 104 can include more than two lockstep circuitries and corresponding pairs of functional circuits coupled therewith, without deviating from the scope of the present disclosure. In such a scenario, each lockstep circuitry is tested in a manner similar to the testing of the first and second lockstep circuitries 106*a* and 106*b* as described above.

The lockstep controller 108 can be coupled with the first and second lockstep circuitries 106*a* and 106*b*. The lockstep controller 108 can include suitable circuitry that can be configured to perform one or more operations. For example, the lockstep controller 108 can be configured to generate the first and second control signals CS1 and CS2 that are indicative of the first and second faults, respectively. The lockstep controller 108 can be further configured to provide the first and second control signals CS1 and CS2 to the first and second lockstep circuitries 106*a* and 106*b* to initiate the testing of the first and second lockstep circuitries 106*a* and 106*b*, respectively. The lockstep controller 108 can be further configured to generate the first and second enable signals EB1 and EB2 to control clock sweeping associated with the first and second lockstep circuitries 106*a* and 106*b*, respectively. The lockstep controller 108 can be further configured to provide the first and second enable signals EB1 and EB2 to the first and second lockstep circuitries 106*a* and 106*b*, respectively.

The lockstep controller 108 can be further configured to generate the first and second configuration data CD1 and CD2, and provide the first and second configuration data CD1 and CD2 to the first and second lockstep circuitries 106*a* and 106*b*, respectively. The lockstep controller 108 can be further configured to generate the first and second masking signals MS1 and MS2, and provide the first and second masking signals MS1 and MS2 to the first and second lockstep circuitries 106*a* and 106*b*, respectively. The first and second masking signals MS1 and MS2 control whether the first and second output data OT1 and OT2 are provided to the second and fourth functional circuits 102*b* and 102*d*, respectively. The lockstep controller 108 can generate the first and second masking signals MS1 and MS2 such that the first and second masking signals MS1 and MS2 are activated while the first and second lockstep circuitries 106*a* and 106*b* are being tested, respectively.

The lockstep controller 108 can be further configured to receive, after the first fault is injected, various status data (such as the first through third status data SD1-SD3) and the first fault indication signal FI1 from the first lockstep circuitry 106*a*. The lockstep controller 108 can be further configured to initiate the diagnosis of the first lockstep circuitry 106*a* based on the first through third status data SD1-SD3 and the first fault indication signal FI1. For example, when the first fault indication signal FI1 is activated, the lockstep controller 108 can determine, based on the third status data SD3, whether the detected one or more faulty bits includes the bit associated with the first fault. Similarly, based on the first and second status data SD1 and SD2, the lockstep controller 108 can determine whether the detected fault is a result of one or both of the fifth and sixth functional circuits operating in a metastable state. The diagnosis of the first lockstep circuitry 106*a* can thus indicate whether the first fault indication signal FI1 (i.e., a logic state of the first fault indication signal FI1) is accurate or inaccurate. For example, if the first fault indication signal FI1 is deactivated and the first status data SD1 indicates that the fifth functional circuit operated in a metastable state during the testing of the first lockstep circuitry 106*a*, the diagnosis of the first lockstep circuitry 106*a* can indicate that the first fault indication signal FI1 being in a deactivated state is inaccurate. Similarly, if the first fault indication signal FI1 is activated and the third status data SD3 indicates that the bit associated with the first fault is not included in the detected one or more faulty bits, the diagnosis of the first lockstep circuitry 106*a* can indicate that the first fault indication signal FI1 being in an activated state is inaccurate.

The lockstep controller 108 can be configured to generate a third masking signal MS3 based on the diagnosis of the first lockstep circuitry 106a. In an embodiment, the lockstep controller 108 activates the third masking signal MS3 (i.e., generates the third masking signal MS3 at a logic high state) when the diagnosis of the first lockstep circuitry 106a indicates that the first fault indication signal FI1 is inaccurate. Further, the lockstep controller 108 deactivates the third masking signal MS3 (i.e., generates the third masking signal MS3 at a logic high state) when the diagnosis of the first lockstep circuitry 106a indicates that the first fault indication signal FI1 is accurate. The lockstep controller 108 can be further coupled with the fault management circuit 110, and configured to provide the third masking signal MS3 to the fault management circuit 110.

The lockstep controller 108 can be further configured to receive, after the second fault is injected, various status data (such as the fourth through sixth status data SD4-SD6) and the second fault indication signal FI2 from the second lockstep circuitry 106b. The lockstep controller 108 can be further configured to initiate the diagnosis of the second lockstep circuitry 106b based on the fourth through sixth status data SD4-SD6 and the second fault indication signal FI2. Further, the lockstep controller 108 can be configured to generate a fourth masking signal MS4 based on the diagnosis of the second lockstep circuitry 106b, and provide the fourth masking signal MS4 to the fault management circuit 110.

The fault management circuit 110 can be coupled with the first and second lockstep circuitries 106a and 106b and the lockstep controller 108. The fault management circuit 110 can include suitable circuitry that can be configured to perform one or more operations. For example, the fault management circuit 110 can be configured to receive the first fault indication signal FI1 from the first lockstep circuitry 106a and the third masking signal MS3 from the lockstep controller 108. Based on the first fault indication signal FI1 and the third masking signal MS3, the fault management circuit 110 can be configured to execute a first recovery operation associated with the first lockstep circuitry 106a. In an embodiment, the fault management circuit 110 executes the first recovery operation when the third masking signal MS3 and the first fault indication signal FI1 are deactivated. Further, when the third masking signal MS3 is activated, the execution of the first recovery operation is masked (i.e., the first recovery operation is not executed) irrespective of the logic state of the first fault indication signal FI1.

The fault management circuit 110 can be similarly configured to receive the second fault indication signal FI2 from the second lockstep circuitry 106b and the fourth masking signal MS4 from the lockstep controller 108, and execute a second recovery operation associated with the second lockstep circuitry 106b. In an embodiment, the fault management circuit 110 executes the second recovery operation when the fourth masking signal MS4 and the second fault indication signal FI2 are deactivated. Further, when the fourth masking signal MS4 is activated, the execution of the second recovery operation is masked (i.e., the second recovery operation is not executed) irrespective of the logic state of the second fault indication signal FI2. The first and second recovery operations can correspond to a reset of the first and second lockstep circuitries 106a and 106b, respectively.

It will be apparent to a person skilled in the art that the first and second lockstep circuitries 106a and 106b are shown to be tested for one fault each to make the illustrations concise and clear and should not be considered as a limitation of the present disclosure. In various other embodiments, the first and second lockstep circuitries 106a and 106b can be tested for multiple times and for various faults (i.e., a different bit is flipped in the first and second output data OT1 and OT2 or the first and second reference data RE1 and RE2), without deviating from the scope of the present disclosure. In such a scenario, the first and second lockstep circuitries 106a and 106b can be tested in a continuous manner or a triggered manner. When the first and second lockstep circuitries 106a and 106b are tested in a triggered manner, the lockstep controller 108 generates multiple control signals (such as the first and second control signals CS1 and CS2) for injecting multiple faults (such as the first and second faults) in the first and second lockstep circuitries 106a and 106b. When the first and second lockstep circuitries 106a and 106b are tested in a continuous manner, upon the initiation of the fault injection by the lockstep controller 108, the subsequent faults are injected in the first and second lockstep circuitries 106a and 106b based on the fault indication signal (such as the first and second fault indication signals FI1 and FI2) generated after each testing instance. In other words, the faults are injected in a sequential manner based on the corresponding fault indication signal.

Figure 2A:
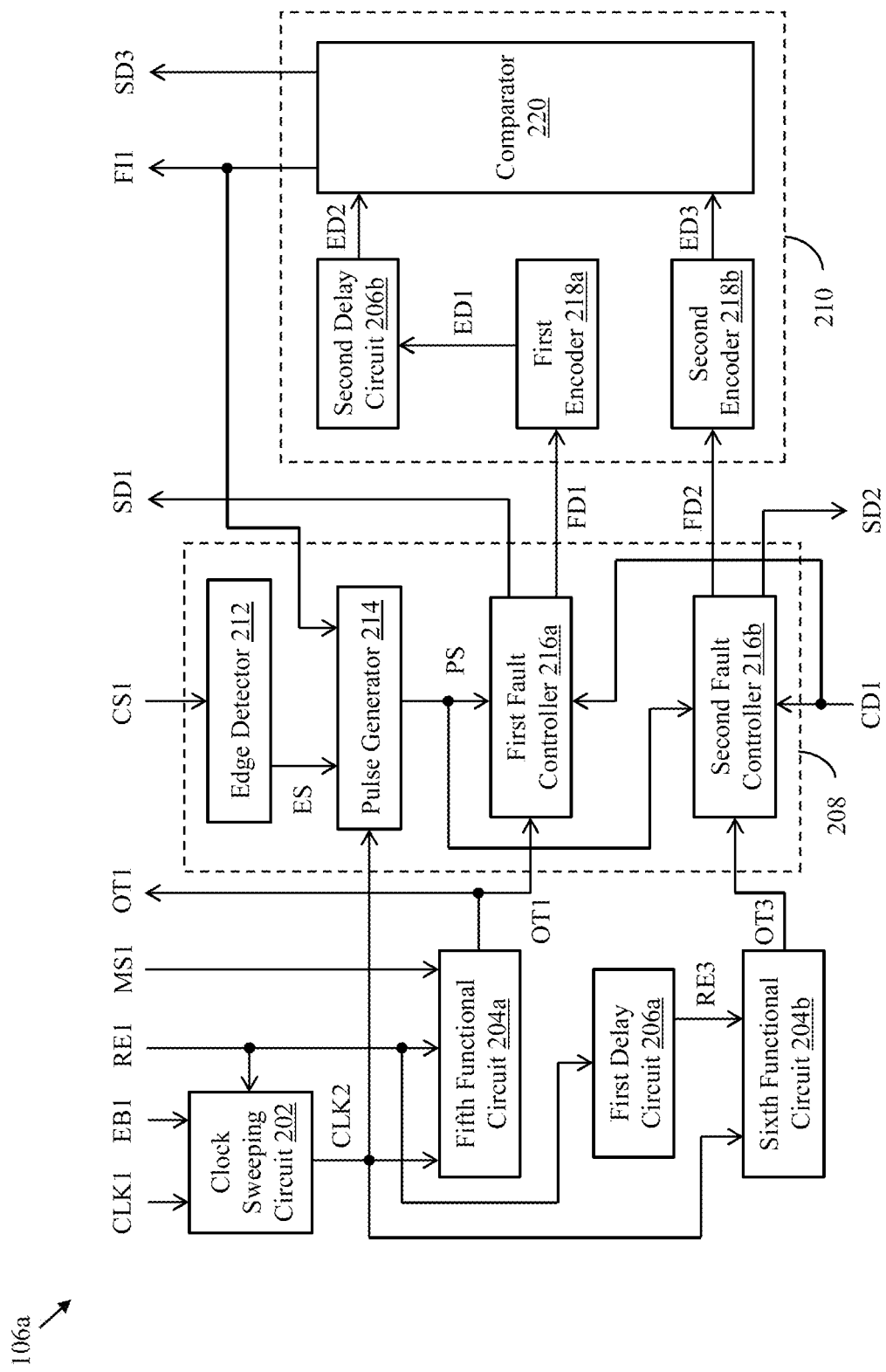
FIG. 2A illustrates a schematic block diagram of first lockstep circuitry of the SoC of FIG. 1 in accordance with an embodiment of the present disclosure.

FIG. 2A illustrates a schematic block diagram of the first lockstep circuitry 106a in accordance with an embodiment of the present disclosure. The first lockstep circuitry 106a can include a clock sweeping circuit 202, the fifth and sixth functional circuits (hereinafter referred to and designated as "the fifth and sixth functional circuits 204a and 204b"), a first delay circuit 206a, a fault injection circuit 208, and a checker circuit 210. The fault injection circuit 208 can include an edge detector 212, a pulse generator 214, and first and second fault controllers 216a and 216b. Further, the checker circuit 210 can include first and second encoders 218a and 218b, a second delay circuit 206b, and a comparator 220.

The clock sweeping circuit 202 can be coupled with a clock generator (not shown), the lockstep controller 108, and the first functional circuit 102a. The clock generator can be internal or external to the first lockstep circuitry 106a. The clock sweeping circuit 202 can include suitable circuitry that can be configured to perform one or more operations. For example, the clock sweeping circuit 202 can be configured to receive the first enable signal EB1, the first reference data RE1, and a first clock signal CLK1 from the lockstep controller 108, the first functional circuit 102a, and the clock generator, respectively. The first enable signal EB1 controls an operation of the clock sweeping circuit 202. In an embodiment, when the first enable signal EB1 is deactivated (i.e., is at a logic low state), the clock sweeping circuit 202 is deactivated (i.e., the clock sweeping circuit 202 is non-operational). Similarly, when the first enable signal EB1 is activated (i.e., is at a logic high state), the clock sweeping circuit 202 is activated (i.e., the clock sweeping circuit 202 is operational). In an embodiment, the first enable signal EB1 is activated when the first functional circuit 102a and the first lockstep circuitry 106a are associated with different clock domains.

When the clock sweeping circuit 202 is operational, the clock sweeping circuit 202 can be further configured to sweep the first clock signal CLK1 with respect to the first reference data RE1 to generate a second clock signal CLK2. Further, the clock sweeping circuit 202 can be coupled with the fifth and sixth functional circuits 204a and 204b and the pulse generator 214, and configured to provide the second clock signal CLK2 to the fifth and sixth functional circuits 204a and 204b and the pulse generator 214.

It will be apparent to a person skilled in the art that the clock sweeping circuit 202 can sweep the first clock signal CLK1 with respect to the first reference data RE1 for a plurality of times to generate the second clock signal CLK2 for the plurality of times. In other words, different combinations of the first reference data RE1 and the second clock signal CLK2 can be generated that can be utilized for exhaustive testing of the first lockstep circuitry 106a.

The fifth and sixth functional circuits 204a and 204b are operable in the lockstep mode. In such a scenario, the fifth functional circuit 204a corresponds to the primary functional circuit and the sixth functional circuit 204b corresponds to the redundant functional circuit that is functionally similar to the fifth functional circuit 204a. The fifth and sixth functional circuits 204a and 204b can include suitable circuitry that can be configured to perform one or more operations. For example, the fifth and sixth functional circuits 204a and 204b can be configured to receive the first reference data RE1 and third reference data RE3, respectively. The fifth functional circuit 204a can be coupled with the first functional circuit 102a for receiving the first reference data RE1. Similarly, the sixth functional circuit 204b can be coupled with the first delay circuit 206a for receiving the third reference data RE3. The fifth and sixth functional circuits 204a and 204b can be further coupled with the clock sweeping circuit 202, and configured to receive the second clock signal CLK2.

The fifth functional circuit 204a can be further configured to generate the first output data OT1 based on the first reference data RE1 and the second clock signal CLK2. Similarly, the sixth functional circuit 204b can be further configured to generate third output data OT3 based on the third reference data RE3 and the second clock signal CLK2. The fifth and sixth functional circuits 204a and 204b can be further coupled with the fault injection circuit 208, and configured to provide the first and third output data OT1 and OT3 to the fault injection circuit 208, respectively. Further, the fifth functional circuit 204a can be coupled with the lockstep controller 108, and configured to receive the first masking signal MS1. The fifth functional circuit 204a can be further coupled with the second functional circuit 102b, and configured to provide, based on the first masking signal MS1, the first output data OT1 to the second functional circuit 102b. In an embodiment, when the first masking signal MS1 is deactivated, the first output data OT1 is provided to the second functional circuit 102b. Further, when the first masking signal MS1 is activated, the first output data OT1 from the fifth functional circuit 204a to the second functional circuit 102b is masked (i.e., the first output data OT1 is not provided to the second functional circuit 102b). The first masking signal MS1 can be generated such that the first masking signal MS1 is activated while the first lockstep circuitry 106a is being tested. Thus, the first masking signal MS1 can facilitate masking of the first output data OT1 from the fifth functional circuit 204a to the second functional circuit 102b while the first lockstep circuitry 106a is being tested. Examples of the fifth and sixth functional circuits 204a and 204b can include DMA controllers, processors, memories, or the like.

The first delay circuit 206a can be coupled with the first functional circuit 102a and the sixth functional circuit 204b. The first delay circuit 206a can include suitable circuitry that can be configured to perform one or more operations. For example, the first delay circuit 206a can be configured to receive the first reference data RE1 from the first functional circuit 102a, and generate the third reference data RE3 such that the third reference data RE3 is a delayed version of the first reference data RE1. In other words, the third reference data RE3 is delayed with respect to the first reference data RE1 by a first predetermined time duration (not shown). The first delay circuit 206a can be further configured to provide the third reference data RE3 to the sixth functional circuit 204b.

The fault injection circuit 208 can be coupled with the fifth and sixth functional circuits 204a and 204b, and configured to receive the first and third output data OT1 and OT3, respectively. The fault injection circuit 208 can be further coupled with the clock sweeping circuit 202, and further configured to receive the second clock signal CLK2. Further, the fault injection circuit 208 can be coupled with the lockstep controller 108, and configured to receive the first control signal CS1 and the first configuration data CD1. Based on the first output data OT1, the second clock signal CLK2, the first control signal CS1, and the first configuration data CD1, the fault injection circuit 208 can be further configured to generate first fault data FD1. Similarly, based on the third output data OT3, the second clock signal CLK2, the first control signal CS1, and the first configuration data CD1, the fault injection circuit 208 can be further configured to generate second fault data FD2. The first and second fault data FD1 and FD2 have exclusively a single bit different than the first and third output data OT1 and OT3, respectively. Further, the fault injection circuit 208 can be configured to receive the first fault indication signal FI1 and update the first and second fault data FD1 and FD2 to facilitate the testing of the first lockstep circuitry 106a in a continuous manner.

The fault injection circuit 208 can be further configured to generate the first and second status data SD1 and SD2 that indicate whether the fifth and sixth functional circuits 204a and 204b operate in a metastable state while the first lockstep circuitry 106a is being tested, respectively. Further, the fault injection circuit 208 can be further configured to provide the first and second status data SD1 and SD2 to the lockstep controller 108 to facilitate the diagnosis of the first lockstep circuitry 106a. The fault injection circuit 208 can include the edge detector 212, the pulse generator 214, and the first and second fault controllers 216a and 216b.

The edge detector 212 can be coupled with the lockstep controller 108. The edge detector 212 can include suitable circuitry that can be configured to perform one or more operations. For example, the edge detector 212 can be configured to receive the first control signal CS1 and generate an edge signal ES. The edge signal ES is indicative of one of positive and negative edges of the first control signal CS1. In an embodiment, the edge detector 212 activates the edge signal ES (i.e., generates the edge signal ES at a logic high state) when the first control signal CS1 transitions from a logic low state to a logic high state. In another embodiment, the edge detector 212 activates the edge signal ES when the first control signal CS1 transitions from a logic high state to a logic low state.

The pulse generator 214 can be coupled with the edge detector 212 and the clock sweeping circuit 202. The pulse generator 214 can include suitable circuitry that can be configured to perform one or more operations. For example, the pulse generator 214 can be configured to receive the edge signal ES and the second clock signal CLK2 from the edge detector 212 and the clock sweeping circuit 202, respectively. Based on the edge signal ES and the second clock signal CLK2, the pulse generator 214 can be configured to generate a pulse signal PS. The pulse signal PS is indicative of a third fault. In an embodiment, the third fault is a transient fault (e.g., a common cause failure). Thus, a combination of the edge detector 212 and the pulse generator 214 converts a static fault (i.e., the first fault) into a transient fault (i.e., the third fault). Further, the pulse generator 214 can be configured to receive the first fault indication signal FI1, and update the pulse signal PS based on the received first fault indication signal FI1 to facilitate the testing of the first lockstep circuitry 106a in a continuous manner.

The first and second fault controllers 216a and 216b can be coupled with the fifth and sixth functional circuits 204a and 204b, respectively, and further coupled with the pulse generator 214 and the lockstep controller 108. The first and second fault controllers 216a and 216b can include suitable circuitry that can be configured to perform one or more operations. For example, the first and second fault controllers 216a and 216b can be configured to receive the first and third output data OT1 and OT3 from the fifth and sixth functional circuits 204a and 204b, respectively. The first and second fault controllers 216a and 216b can be further configured to receive the pulse signal PS from the pulse generator 214. Further, the first and second fault controllers 216a and 216b can be configured to receive the first configuration data CD1 from the lockstep controller 108.

The first fault controller 216a can be further configured to generate the first fault data FD1 based on the first output data OT1, the pulse signal PS, and the first configuration data CD1. Similarly, the second fault controller 216b can be further configured to generate the second fault data FD2 based on the third output data OT3, the pulse signal PS, and the first configuration data CD1. To generate the first and second fault data FD1 and FD2, the first and second fault controllers 216a and 216b can be further configured to inject, based on the pulse signal PS and the first configuration data CD1 in a one-hot manner, the third fault (i.e., the transient fault) in the first and third output data OT1 and OT3, respectively. The injecting of the transient fault in a one-hot manner corresponds to the flipping of a single bit of each of the first and third output data OT1 and OT3. Thus, the first and second fault data FD1 and FD2 have exclusively a single bit different than the first and third output data OT1 and OT3, respectively.

The first and second fault controllers 216a and 216b can be further configured to generate the first and second status data SD1 and SD2 that indicate whether the fifth and sixth functional circuits 204a and 204b operate in a metastable state while the first lockstep circuitry 106a is being tested, respectively. The first and second fault controllers 216a and 216b can be further configured to provide the first and second status data SD1 and SD2 to the lockstep controller 108 to facilitate the diagnosis of the first lockstep circuitry 106a.

The checker circuit 210 can be coupled with the first and second fault controllers 216a and 216b (i.e., the fault injection circuit 208), and configured to receive the first and second fault data FD1 and FD2, respectively. The checker circuit 210 can be further configured to test whether the first lockstep circuitry 106a is faulty based on the first and second fault data FD1 and FD2, and generate the first fault indication signal FI1 that indicates whether the first lockstep circuitry 106a is faulty. In an embodiment, the first fault indication signal FI1 is deactivated when the first lockstep circuitry 106a is faulty. Further, the first fault indication signal FI1 is activated when the first lockstep circuitry 106a is operating in a desired manner. Further, the checker circuit 210 can be coupled with the lockstep controller 108 and the fault management circuit 110, and configured to provide the first fault indication signal FI1 to the lockstep controller 108 and the fault management circuit 110. The checker circuit 210 can be further coupled with the pulse generator 214, and further configured to provide the first fault indication signal FI1 to the pulse generator 214 when the first lockstep circuitry 106a is tested in a continuous manner. The checker circuit 210 can be further configured to generate the third status data SD3 and provide the third status data SD3 to the lockstep controller 108 to facilitate the diagnosis of the first lockstep circuitry 106a. The checker circuit 210 can include the first and second encoders 218a and 218b, the second delay circuit 206b, and the comparator 220.

The first encoder 218a can be coupled with the first fault controller 216a (i.e., the fault injection circuit 208). The first encoder 218a can include suitable circuitry that can be configured to perform one or more operations. For example, the first encoder 218a can be configured to receive the first fault data FD1 from the first fault controller 216a, and generate first encoded data ED1. The first encoded data ED1 can be generated such that a number of bits associated with the first encoded data ED1 is less than a number of bits associated with the first fault data FD1.

The second delay circuit 206b can be coupled with the first encoder 218a. The second delay circuit 206b can include suitable circuitry that can be configured to perform one or more operations. For example, the second delay circuit 206b can be configured to receive the first encoded data ED1 from the first encoder 218a, and generate second encoded data ED2 such that the second encoded data ED2 is a delayed version of the first encoded data ED1. In other words, the second encoded data ED2 is delayed with respect to the first encoded data ED1 by a second predetermined time duration (not shown). In an embodiment, the second predetermined time duration is equal to the first predetermined time duration.

The second encoder 218b can be coupled with the second fault controller 216b (i.e., the fault injection circuit 208). The second encoder 218b can include suitable circuitry that can be configured to perform one or more operations. For example, the second encoder 218b can be configured to receive the second fault data FD2 from the second fault controller 216b, and generate third encoded data ED3. The third encoded data ED3 can be generated such that a number of bits associated with the third encoded data ED3 is less than a number of bits associated with the second fault data FD2.

The comparator 220 can be coupled with the second delay circuit 206b, the second encoder 218b, the lockstep controller 108, and the fault management circuit 110. The comparator 220 can include suitable circuitry that can be configured to perform one or more operations. For example, the comparator 220 can be configured to receive the second and third encoded data ED2 and ED3 from the second delay circuit 206b and the second encoder 218b, respectively. The comparator 220 can be further configured to test whether the first lockstep circuitry 106a is faulty by comparing the second and third encoded data ED2 and ED3. A match between the second and third encoded data ED2 and ED3 indicates that the first lockstep circuitry 106a is faulty. Similarly, a mismatch between the second and third encoded data ED2 and ED3 indicates that the first lockstep circuitry 106a is operating in a desired manner. Based on a result of the comparison of the second and third encoded data ED2 and ED3, the comparator 220 can be further configured to generate the first fault indication signal FI1. The first fault indication signal FI1 is deactivated when the second and third encoded data ED2 and ED3 match, and activated when the second and third encoded data ED2 and ED3 do not match. The comparator 220 can be further configured to provide the first fault indication signal FI1 to the lockstep controller 108 and the fault management circuit 110. The comparator 220 can be further coupled with the pulse generator 214, and further configured to provide the first fault indication signal FI1 to the pulse generator 214 when the first lockstep circuitry 106a is tested in a continuous manner.

The comparator 220 can be further configured to generate the third status data SD3. The third status data SD3 can be indicative of one or more bits associated with the second and third encoded data ED2 and ED3 that are faulty. In other words, the third status data SD3 can be indicative of the one or more faulty bits that are detected in the first lockstep circuitry 106a after the fault injection. The comparator 220 can be further configured to provide the third status data SD3 to the lockstep controller 108 to facilitate the diagnosis of the first lockstep circuitry 106a.

Although FIG. 2A illustrates that the first fault indication signal FI1 is provided to the fault management circuit 110 while the first lockstep circuitry 106a is being tested, it will be apparent to a person skilled in the art that the scope of the present disclosure is not limited to it. In various other embodiments, a first gating circuit (not shown) can be coupled between the comparator 220 and the fault management circuit 110 to control whether the first fault indication signal FI1 is provided to the fault management circuit 110, without deviating from the scope of the present disclosure. In such a scenario, the first gating circuit can be activated while the first lockstep circuitry 106a is being tested to mask the first fault indication signal FI1 from the comparator 220 to the fault management circuit 110. The activation and deactivation of the first gating circuit can be controlled by the lockstep controller 108 by way of a third enable signal (not shown).

It will be apparent to a person skilled in the art that the scope of the present disclosure is not limited to the first lockstep circuitry 106a including the first and second delay circuits 206a and 206b. In various other embodiments, the first lockstep circuitry 106a can be sans the first and second delay circuits 206a and 206b, without deviating from the scope of the present disclosure. In such a scenario, the fifth and sixth functional circuits 204a and 204b can receive the same reference data (i.e., the first reference data RE1), and the comparator 220 can test whether the first lockstep circuitry 106a is faulty by comparing the first and third encoded data ED1 and ED3.

In operation, the first functional circuit 102a can generate the first reference data RE1, and provide the first reference data RE1 to the first lockstep circuitry 106a. The first lockstep circuitry 106a implements the lockstep architecture, whereby the fifth functional circuit 204a is the primary functional circuit and the sixth functional circuit 204b is the redundant functional circuit that is functionally similar to the fifth functional circuit 204a. The clock sweeping circuit 202 and the fifth functional circuit 204a can receive the first reference data RE1 from the first functional circuit 102a. The clock sweeping circuit 202 can further receive the first clock signal CLK1 from the clock generator, and sweep the first clock signal CLK1 with respect to the first reference data RE1 to generate the second clock signal CLK2.

The fifth functional circuit 204a can further receive the second clock signal CLK2 from the clock sweeping circuit 202. Based on the first reference data RE1 and the second clock signal CLK2, the fifth functional circuit 204a can generate the first output data OT1. Further, the fifth functional circuit 204a can receive the first masking signal MS1 from the lockstep controller 108. Based on the first masking signal MS1, the fifth functional circuit 204a can provide the first output data OT1 to the second functional circuit 102b or the first output data OT1 from the fifth functional circuit 204a to the second functional circuit 102b can be masked. In an embodiment, the first output data OT1 from the fifth functional circuit 204a to the second functional circuit 102b is masked while the first lockstep circuitry 106a is being tested. The first delay circuit 206a can receive the first reference data RE1 and generate the third reference data RE3 such that the third reference data RE3 is the delayed version of the first reference data RE1. The sixth functional circuit 204b can receive the second clock signal CLK2 and the third reference data RE3, and generate the third output data OT3.

While the fifth and sixth functional circuits 204a and 204b are generating the first and third output data OT1 and OT3, respectively, the edge detector 212 can receive the first control signal CS1 from the lockstep controller 108. The first control signal CS1 can be indicative of the first fault (i.e., a static fault) that is to be injected in the first lockstep circuitry 106a. Based on the first control signal CS1, the edge detector 212 can generate the edge signal ES that is indicative of one of the positive and negative edges of the first control signal CS1. The pulse generator 214 can receive the edge signal ES and the second clock signal CLK2, and generate the pulse signal PS. Thus, the static fault (i.e., the first fault) associated with the first control signal CS1 is converted to the transient fault (i.e., the third fault) associated with the pulse signal PS.

The first and second fault controllers 216a and 216b can receive the pulse signal PS and the first configuration data CD1. The first and second fault controllers 216a and 216b can further receive the first and third output data OT1 and OT3, respectively. Based on the first output data OT1, the pulse signal PS, and the first configuration data CD1, the first fault controller 216a can generate the first fault data FD1. To generate the first fault data FD1, the first fault controller 216a can inject the third fault associated with the pulse signal PS in the first output data OT1 in a one-hot manner. The second fault controller 216b can similarly generate the second fault data FD2 based on the third output data OT3, the pulse signal PS, and the first configuration data CD1. The first and second fault controllers 216a and 216b can further generate and provide the first and second status data SD1 and SD2 to the lockstep controller 108, respectively.

The first encoder 218a can receive the first fault data FD1 and generate the first encoded data ED1. The second delay circuit 206b can then receive the first encoded data ED1 and generate the second encoded data ED2 such that the second encoded data ED2 is the delayed version of the first encoded data ED1. In an embodiment, the delay between the first and second encoded data ED1 and ED2 is same as the delay between the first and third reference data RE1 and RE3. Similarly, the second encoder 218b can receive the second fault data FD2 and generate the third encoded data ED3.

The comparator 220 can receive the second and third encoded data ED2 and ED3 and test whether the first lockstep circuitry 106a is faulty by comparing the second and third encoded data ED2 and ED3. As the first fault is injected in the first lockstep circuitry 106a, a mismatch between the second and third encoded data ED2 and ED3 can be indicative of the first lockstep circuitry 106a operating in a desired manner. In other words, a mismatch between the second and third encoded data ED2 and ED3 can indicate that the injected first fault is accurately detected in the first lockstep circuitry 106a. Conversely, a match between the second and third encoded data ED2 and ED3 can indicate that the first lockstep circuitry 106a is faulty. The comparator 220 can generate the first fault indication signal FI1 based on the result of the comparison of the second and third encoded data ED2 and ED3. The first fault indication signal FI1 is deactivated when the second and third encoded data ED2 and ED3 match, and activated when the second and third encoded data ED2 and ED3 do not match. The comparator 220 can then provide the first fault indication signal FI1 to the lockstep controller 108 and the fault management circuit 110. The comparator 220 can further generate and provide the third status data SD3 to the lockstep controller 108.

The lockstep controller 108 can further receive the first through third status data SD1-SD3 and the first fault indication signal FI1. Based on the first through third status data SD1-SD3 and the first fault indication signal FI1, the lockstep controller 108 can initiate the diagnosis of the first lockstep circuitry 106a. Although FIG. 2A describes that the lockstep controller 108 can initiate the diagnosis of the first lockstep circuitry 106a based on the first through third status data SD1-SD3, it will be apparent to a person skilled in the art that the scope of the present disclosure is not limited to it. In various other embodiments, the lockstep controller 108 may utilize various other status data received from the first lockstep circuitry 106a to initiate the diagnosis of the first lockstep circuitry 106a, without deviating from the scope of the present disclosure. Such status data can be generated by a first set of monitoring circuits (not shown). The first set of monitoring circuits can be coupled with the first and second fault controllers 216a and 216b and the fifth and sixth functional circuits 204a and 204b, and generate the status data based on the first and second fault data FD1 and FD2 and the first and third output data OT1 and OT3.

The lockstep controller 108 can further generate the third masking signal MS3 based on the diagnosis of the first lockstep circuitry 106a. Further, the fault management circuit 110 can receive the first fault indication signal FI1 from the comparator 220 and the third masking signal MS3 from the lockstep controller 108, and execute the first recovery operation when the first fault indication signal FI1 and the third masking signal MS3 are deactivated. When the third masking signal MS3 is activated, the execution of the first recovery operation is masked.

The first lockstep circuitry 106a is thus tested. The present disclosure is however not limited to the first lockstep circuitry 106a being tested for a single fault (i.e., the first fault). The first lockstep circuitry 106a can be tested for various different faults that are injected in a one-hot manner. Further, for each bit of the first output data OT1, the first clock signal CLK1 is swept with respect to the first reference data RE1 for the plurality of times to generate the second clock signal CLK2 for the plurality of times. The first lockstep circuitry 106a is then tested for each of the plurality of times. For example, if a number of bits of the first output data OT1 is "32" and the first clock signal CLK1 is swept "15" times, the first lockstep circuitry 106a is tested 480 times (i.e., 32*15). Each of such fault injection can be initiated by the lockstep controller 108a by way of a control signal (such as the first control signal CS1). Alternatively, the first lockstep circuitry 106a can be configured such that the first fault indication signal FI1 can be provided to the pulse generator 214 to update the pulse signal PS, and in turn, the first and second fault data FD1 and FD2. In other words, the first lockstep circuitry 106a can be tested in a continuous manner based on the first fault indication signal FI1. Further, the first fault indication signal FI1 generated during each testing instance is provided to the fault management circuit 110 to facilitate the execution of the first recovery operation. It will be apparent to a person skilled in the art that the second lockstep circuitry 106b is tested in a similar manner as described above.

Figure 2B:
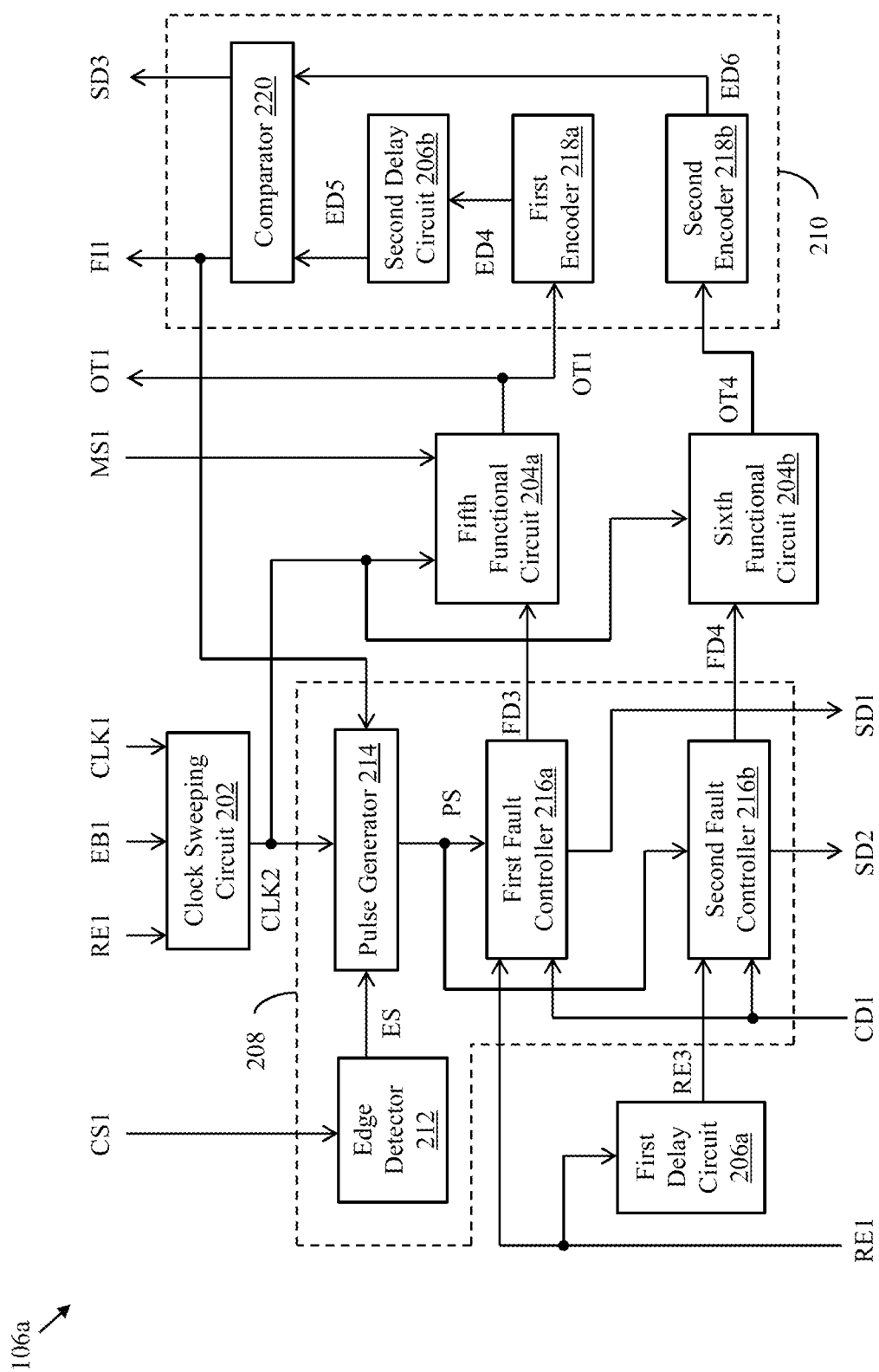
FIG. 2B illustrates a schematic block diagram of the first lockstep circuitry in accordance with another embodiment of the present disclosure.

FIG. 2B illustrates a schematic block diagram of the first lockstep circuitry 106a in accordance with another embodiment of the present disclosure. The first lockstep circuitry 106a can include the clock sweeping circuit 202, the fifth and sixth functional circuits 204a and 204b, the first delay circuit 206a, the fault injection circuit 208, and the checker circuit 210. The fault injection circuit 208 can include the edge detector 212, the pulse generator 214, and the first and second fault controllers 216a and 216b. Further, the checker circuit 210 can include the first and second encoders 218a and 218b, the second delay circuit 206b, and the comparator 220.

The structure and functionalities of the clock sweeping circuit 202 and the first delay circuit 206a remain same as described in FIG. 2A. The difference between the embodiments of FIG. 2A and FIG. 2B is that the third fault is injected at the input stage of the fifth and sixth functional circuits 204a and 204b, as opposed to at the output stage of the fifth and sixth functional circuits 204a and 204b as described in FIG. 2A. Hence, as illustrated in FIG. 2B, the fifth and sixth functional circuits 204a and 204b are coupled between the fault injection circuit 208 and the checker circuit 210.

The fault injection circuit 208 can thus be coupled with the first functional circuit 102a and the first delay circuit 206a, and configured to receive the first and third reference data RE1 and RE3, respectively. The fault injection circuit 208 can be further coupled with the clock sweeping circuit 202, and further configured to receive the second clock signal CLK2. Further, the fault injection circuit 208 can be coupled with the lockstep controller 108, and configured to receive the first control signal CS1 and the first configuration data CD1. Based on the first and third reference data RE1 and RE3, the second clock signal CLK2, the first control signal CS1, and the first configuration data CD1, the fault injection circuit 208 can be further configured to generate third and fourth fault data FD3 and FD4. The third and fourth fault data FD3 and FD4 have exclusively a single bit different than the first and third reference data RE1 and RE3, respectively. Further, the fault injection circuit 208 can be configured to receive the first fault indication signal FI1 and update the third and fourth fault data FD3 and FD4 to facilitate the testing of the first lockstep circuitry 106a in a continuous manner. The fault injection circuit 208 can be further configured to generate and provide the first and second status data SD1 and SD2 to the lockstep controller 108 to facilitate the diagnosis of the first lockstep circuitry 106a.

The edge detector 212 can be configured to receive the first control signal CS1 and generate the edge signal ES. The pulse generator 214 can be coupled with the edge detector 212 and the clock sweeping circuit 202, and configured to receive the edge signal ES and the second clock signal CLK2, respectively. Based on the edge signal ES and the second clock signal CLK2, the pulse generator 214 can be configured to generate the pulse signal PS. Further, the pulse generator 214 can be further configured to receive the first fault indication signal FI1 and update the pulse signal PS based on the received first fault indication signal FI1 to facilitate the testing of the first lockstep circuitry 106a in a continuous manner.

The first and second fault controllers 216a and 216b can be coupled with the first functional circuit 102a and the first delay circuit 206a, and configured to receive the first and third reference data RE1 and RE3, respectively. The first and second fault controllers 216a and 216b can be further coupled with the pulse generator 214, and further configured to receive the pulse signal PS. Further, the first and second fault controllers 216a and 216b can be coupled with the lockstep controller 108, and configured to receive the first configuration data CD1. The first fault controller 216a can be further configured to generate the third fault data FD3 based on the first reference data RE1, the pulse signal PS, and the first configuration data CD1 Similarly, the second fault controller 216b can be further configured to generate the fourth fault data FD4 based on the third reference data RE3, the pulse signal PS, and the first configuration data CD1. The third and fourth fault data FD3 and FD4 are generated in a manner similar to that of the generation of the first and second fault data FD1 and FD2, respectively.

The first and second fault controllers 216a and 216b can be further configured to generate the first and second status data SD1 and SD2 that indicate whether the fifth and sixth functional circuits 204a and 204b operate in a metastable state while the first lockstep circuitry 106a is being tested, respectively. Further, the first and second fault controllers 216a and 216b can be further configured to provide the first and second status data SD1 and SD2 to the lockstep controller 108 to facilitate the diagnosis of the first lockstep circuitry 106a.

The fifth and sixth functional circuits 204a and 204b are operable in the lockstep mode. In such a scenario, the fifth functional circuit 204a corresponds to the primary functional circuit and the sixth functional circuit 204b corresponds to the redundant functional circuit that is functionally similar to the fifth functional circuit 204a. The fifth and sixth functional circuits 204a and 204b can be coupled with the first and second fault controllers 216a and 216b, and configured to receive the third and fourth fault data FD3 and FD4, respectively. The fifth and sixth functional circuits 204a and 204b can be further coupled with the clock sweeping circuit 202, and configured to receive the second clock signal CLK2. The fifth functional circuit 204a can be further configured to generate the first output data OT1 based on the third fault data FD3 and the second clock signal CLK2. Similarly, the sixth functional circuit 204b can be further configured to generate fourth output data OT4 based on the fourth fault data FD4 and the second clock signal CLK2. The fifth and sixth functional circuits 204a and 204b can be further coupled with the checker circuit 210, and configured to provide the first and fourth output data OT1 and OT4 to the checker circuit 210.

The fifth functional circuit 204a can be further coupled with the lockstep controller 108, and further configured to receive the first masking signal MS1. The fifth functional circuit 204a can be further coupled with the second functional circuit 102b, and configured to provide, based on the first masking signal MS1, the first output data OT1 to the second functional circuit 102b. In an embodiment, when the first masking signal MS1 is deactivated, the first output data OT1 is provided to the second functional circuit 102b. Further, when the first masking signal MS1 is activated, the first output data OT1 from the fifth functional circuit 204a to the second functional circuit 102b is masked (i.e., the first output data OT1 is not provided to the second functional circuit 102b). As the first output data OT1 is generated based on the third fault data FD3, the first masking signal MS1 can be generated such that the first masking signal MS1 is activated while the first lockstep circuitry 106a is being tested.

The checker circuit 210 can be coupled with the fifth and sixth functional circuits 204a and 204b, and configured to receive the first and fourth output data OT1 and OT4, respectively. The checker circuit 210 can be further configured to test whether the first lockstep circuitry 106a is faulty based on the first and fourth output data OT1 and OT4, and generate the first fault indication signal FI1 that indicates whether the first lockstep circuitry 106a is faulty. Further, the checker circuit 210 can be coupled with the lockstep controller 108 and the fault management circuit 110, and configured to provide the first fault indication signal FI1 to the lockstep controller 108 and the fault management circuit 110. The checker circuit 210 can be further coupled with the pulse generator 214, and further configured to provide the first fault indication signal FI1 to the pulse generator 214 when the first lockstep circuitry 106a is tested in a continuous manner. The checker circuit 210 can be further configured to generate the third status data SD3 and provide the third status data SD3 to the lockstep controller 108 to facilitate the diagnosis of the first lockstep circuitry 106a.

The first encoder 218a can be coupled with the fifth functional circuit 204a, and configured to receive the first output data OT1 and generate fourth encoded data ED4. The fourth encoded data ED4 can be generated such that a number of bits associated with the fourth encoded data ED4 is less than a number of bits associated with the first output data OT1. The second delay circuit 206b can be coupled with the first encoder 218a, and configured to receive the fourth encoded data ED4 and generate fifth encoded data ED5 such that the fifth encoded data ED5 is a delayed version of the fourth encoded data ED4. The second encoder 218b can be coupled with the sixth functional circuit 204b, and configured to receive the fourth output data OT4 and generate sixth encoded data ED6. The sixth encoded data ED6 can be generated such that a number of bits associated with the sixth encoded data ED6 is less than a number of bits associated with the fourth output data OT4.

The comparator 220 can be coupled with the second delay circuit 206b and the second encoder 218b, and configured to receive the fifth and sixth encoded data ED5 and ED6, respectively. The comparator 220 can be further configured to test whether the first lockstep circuitry 106a is faulty by comparing the fifth and sixth encoded data ED5 and ED6. A match between the fifth and sixth encoded data ED5 and ED6 indicates that the first lockstep circuitry 106a is faulty. Similarly, a mismatch between the fifth and sixth encoded data ED5 and ED6 indicates that the first lockstep circuitry 106a is operating in a desired manner. Based on a result of the comparison of the fifth and sixth encoded data ED5 and ED6, the comparator 220 can be further configured to generate the first fault indication signal FI1. The first fault indication signal FI1 is deactivated when the fifth and sixth encoded data ED5 and ED6 match, and activated when the fifth and sixth encoded data ED5 and ED6 do not match. The comparator 220 can be further coupled with the lockstep controller 108 and the fault management circuit 110, and further configured to provide the first fault indication signal FI1 to the lockstep controller 108 and the fault management circuit 110. The comparator 220 can be further coupled with the pulse generator 214, and further configured to provide the first fault indication signal FI1 to the pulse generator 214 when the first lockstep circuitry 106a is tested in a continuous manner. Further, the comparator 220 can be configured to generate and provide the third status data SD3 to the lockstep controller 108 to facilitate the diagnosis of the first lockstep circuitry 106a.

In operation, the first functional circuit 102a can generate the first reference data RE1, and provide the first reference data RE1 to the first lockstep circuitry 106a. The first lockstep circuitry 106a implements a lockstep architecture (i.e., the fifth and sixth functional circuits 204a and 204b are operable in the lockstep mode to prevent corruption of an output of the fifth functional circuit 204a (i.e., the first output data OT1)). The clock sweeping circuit 202, the first delay circuit 206a, and the first fault controller 216a can receive the first reference data RE1 from the first functional circuit 102a. The clock sweeping circuit 202 can further receive the first clock signal CLK1 from the clock generator and sweep the first clock signal CLK1 with respect to the first reference data RE1 to generate the second clock signal CLK2. The first delay circuit 206a can generate the third reference data RE3 such that the third reference data RE3 is the delayed version of the first reference data RE1. The first delay circuit 206a can further provide the third reference data RE3 to the second fault controller 216b.

The edge detector 212 can receive the first control signal CS1 from the lockstep controller 108, and generate the edge signal ES that is indicative of one of the positive and negative edges of the first control signal CS1. The pulse generator 214 can receive the edge signal ES and the second clock signal CLK2, and generate the pulse signal PS. The first and second fault controllers 216a and 216b can receive the pulse signal PS from the pulse generator 214 and the first configuration data CD1 from the lockstep controller 108. Based on the first reference data RE1, the pulse signal PS, and the first configuration data CD1, the first fault controller 216a can generate the third fault data FD3. The second fault controller 216b can similarly generate the fourth fault data FD4 based on the third reference data RE3, the pulse signal PS, and the first configuration data CD1. The first and second fault controllers 216a and 216b can further provide the third and fourth fault data FD3 and FD4 to the fifth and sixth functional circuits 204a and 204b, respectively. The first and second fault controllers 216a and 216b can further generate and provide the first and second status data SD1 and SD2 to the lockstep controller 108, respectively.

The fifth functional circuit 204a can further receive the second clock signal CLK2 from the clock sweeping circuit 202. Based on the third fault data FD3 and the second clock signal CLK2, the fifth functional circuit 204a can generate the first output data OT1. Further, the fifth functional circuit 204a can receive the first masking signal MS1 from the lockstep controller 108. Based on the first masking signal MS1, the fifth functional circuit 204a can provide the first output data OT1 to the second functional circuit 102b or the first output data OT1 from the fifth functional circuit 204a to the second functional circuit 102b can be masked. As the first output data OT1 is generated based on the third fault data FD3, the first output data OT1 from the fifth functional circuit 204a to the second functional circuit 102b is masked. Further, based on the fourth fault data FD4 and the second clock signal CLK2, the sixth functional circuit 204b can generate the fourth output data OT4.

The first encoder 218a can receive the first output data OT1 from the fifth functional circuit 204a, and generate the fourth encoded data ED4. The second delay circuit 206b can then receive the fourth encoded data ED4 and generate the fifth encoded data ED5 such that the fifth encoded data ED5 is the delayed version of the fourth encoded data ED4. In an embodiment, the delay between the fourth and fifth encoded data ED4 and ED5 is same as the delay between the first and third reference data RE1 and RE3. The second encoder 218b can receive the fourth output data OT4 from the sixth functional circuit 204b, and generate the sixth encoded data ED6. The comparator 220 can receive the fifth and sixth encoded data ED5 and ED6 and test whether the first lockstep circuitry 106a is faulty by comparing the fifth and sixth encoded data ED5 and ED6.

As the first fault is injected in the first lockstep circuitry 106a, a mismatch between the fifth and sixth encoded data ED5 and ED6 can be indicative of the first lockstep circuitry 106a operating in a desired manner. In other words, a mismatch between the fifth and sixth encoded data ED5 and ED6 can indicate that the injected first fault is accurately detected in the first lockstep circuitry 106a. Conversely, a match between the fifth and sixth encoded data ED5 and ED6 can indicate that the first lockstep circuitry 106a is faulty. The comparator 220 can generate the first fault indication signal FI1 based on the result of the comparison of the fifth and sixth encoded data ED5 and ED6. The comparator 220 can then provide the first fault indication signal FI1 to the lockstep controller 108 and the fault management circuit 110. The comparator 220 can further generate and provide the third status data SD3 to the lockstep controller 108.

The lockstep controller 108 can further receive the first through third status data SD1-SD3 and the first fault indication signal FI1. Based on the first through third status data SD1-SD3 and the first fault indication signal FI1, the lockstep controller 108 can initiate the diagnosis of the first lockstep circuitry 106a. Although FIG. 2B describes that the lockstep controller 108 can initiate the diagnosis of the first lockstep circuitry 106a based on the first through third status data SD1-SD3, it will be apparent to a person skilled in the art that the scope of the present disclosure is not limited to it. In various other embodiments, the lockstep controller 108 may utilize various other status data received from the first lockstep circuitry 106a to initiate the diagnosis of the first lockstep circuitry 106a, without deviating from the scope of the present disclosure. Such status data can be generated by a second set of monitoring circuits (not shown). The second set of monitoring circuits can be coupled with the first and second fault controllers 216a and 216b and the fifth and sixth functional circuits 204a and 204b, and generate the status data based on the third and fourth fault data FD3 and FD4 and the first and fourth output data OT1 and OT4.

The lockstep controller 108 can further generate the third masking signal MS3 based on the diagnosis of the first lockstep circuitry 106a. Further, the fault management circuit 110 can receive the first fault indication signal FI1 from the comparator 220 and the third masking signal MS3 from the lockstep controller 108, and execute the first recovery operation when the first fault indication signal FI1 and the third masking signal MS3 are deactivated. When the third masking signal MS3 is activated, the execution of the first recovery operation is masked.

The first lockstep circuitry 106a is thus tested. The present disclosure is however not limited to the first lockstep circuitry 106a being tested for a single fault (i.e., the first fault). The first lockstep circuitry 106a can be tested for various different faults that are injected in a one-hot manner. Each of such fault injection can be initiated by the lockstep controller 108a by way of a control signal (such as the first control signal CS1). Alternatively, the first lockstep circuitry 106a can be configured such that the first fault indication signal FI1 can be provided to the pulse generator 214 to update the pulse signal PS, and in turn, the first and second fault data FD1 and FD2. In other words, the first lockstep circuitry 106a can be tested in a continuous manner based on the first fault indication signal FI1. Further, the first fault indication signal FI1 generated during each testing instance is provided to the fault management circuit 110 to facilitate the execution of the first recovery operation. It will be apparent to a person skilled in the art that the second lockstep circuitry 106b is tested in a similar manner as described above.

Thus, the testing technique implemented by the lockstep testing system 104 of the present disclosure is sans any alteration of codes associated with the fifth and sixth functional circuits 204a and 204b. As a result, a possibility of the fifth and sixth functional circuits 204a and 204b operating in an uncontrolled manner is significantly less as compared to that associated with a conventional testing technique that includes altering codes of a functional circuit in a lockstep architecture. Further, each lockstep circuitry (such as the first and second lockstep circuitry 106a and 106b) is tested for various conditions such as different combinations of the first reference data RE1 and the second clock signal CLK2 and different faults that are injected in the first and third output data OT1 and OT3 or the first and third reference data RE1 and RE3. Hence, a degree of testing of the lockstep architecture facilitated by the testing technique of the present disclosure is significantly greater than that facilitated by the conventional testing technique. Further, the testing technique implemented by the lockstep testing system 104 of the present disclosure includes injection of transient faults (e.g., the third fault) in each lockstep circuitry. As a result, a reliability of the testing technique implemented by the lockstep testing system 104 of the present disclosure is significantly greater than that of the conventional testing technique that facilitates a limited degree of testing of the lockstep architecture and includes injection of static faults.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A lockstep testing system, comprising:
a lockstep controller configured to generate a first control signal; and
plurality of lockstep circuitries coupled with the lockstep controller, wherein first lockstep circuitry of the plurality of lockstep circuitries comprises:
   a plurality of functional circuits configured to receive first and second reference data and generate first and second output data;
   a fault injection circuit that is coupled with the lockstep controller and the plurality of functional circuits, and configured to receive the first control signal and the first and second output data, and generate first and second fault data; and
   a checker circuit that is coupled with the fault injection circuit and the lockstep controller, and configured to receive the first and second fault data, test whether the first lockstep circuitry is faulty, and generate and provide, to the lockstep controller, a fault indication signal that indicates whether the first lockstep circuitry is faulty.

2. The lockstep testing system of claim 1, wherein the first lockstep circuitry further comprises a first delay circuit that is configured to receive the first reference data and generate the second reference data such that the second reference data is a delayed version of the first reference data.

3. The lockstep testing system of claim 1, wherein the fault injection circuit comprises:
   an edge detector that is coupled with the lockstep controller, and configured to receive the first control signal and generate an edge signal, wherein the edge signal is indicative of one of positive and negative edges of the first control signal;
   a pulse generator that is coupled with the edge detector, and configured to receive the edge signal and a first clock signal, and generate a pulse signal; and
   first and second fault controllers that are coupled with first and second functional circuits of the plurality of functional circuits, and configured to receive the first and second output data, respectively, wherein the first and second fault controllers are further coupled with the pulse generator, and further configured to receive the pulse signal, and wherein the first fault controller is further configured to generate the first fault data based on the first output data and the pulse signal, and the second fault controller is further configured to generate the second fault data based on the second output data and the pulse signal.

4. The lockstep testing system of claim 3, wherein the first lockstep circuitry further comprises a clock sweeping circuit that is coupled with the first and second functional circuits and the pulse generator, wherein the clock sweeping circuit is configured to receive the first reference data and a second clock signal, sweep the second clock signal with respect to the first reference data to generate the first clock signal, and provide the first clock signal to the first and second functional circuits and the pulse generator, and wherein the first and second functional circuits further generate the first and second output data, respectively, based on the first clock signal.

5. The lockstep testing system of claim 3, wherein to generate the first and second fault data, the first and second fault controllers are further configured to inject, based on the pulse signal in a one-hot manner, a transient fault in the first and second output data, respectively.

6. The lockstep testing system of claim 3, wherein the first and second fault controllers are further coupled with the lockstep controller, and configured to generate first and second status data that indicate whether the first and second functional circuits operate in a metastable state while the first lockstep circuitry is being tested, respectively, and provide the first and second status data to the lockstep controller, and wherein the lockstep controller is further configured to initiate a diagnosis of the first lockstep circuitry based on the first and second status data and the fault indication signal.

7. The lockstep testing system of claim 1, wherein the checker circuit comprises:
   a first encoder that is coupled with the fault injection circuit, and configured to receive the first fault data and generate first encoded data;
   a second delay circuit that is coupled with the first encoder, and configured to receive the first encoded data and generate second encoded data such that the second encoded data is a delayed version of the first encoded data; and
   a second encoder that is coupled with the fault injection circuit, and configured to receive the second fault data and generate third encoded data.

8. The lockstep testing system of claim 7, wherein the checker circuit further comprises a comparator that is coupled with the second delay circuit, the second encoder, and the lockstep controller, and configured to:
- receive the second and third encoded data from the second delay circuit and the second encoder, respectively;
- test whether the first lockstep circuitry is faulty by comparing the second and third encoded data;
- generate the fault indication signal based on a result of the comparison of the second and third encoded data, wherein the fault indication signal is deactivated when the second and third encoded data match, and activated when the second and third encoded data do not match; and
- provide the fault indication signal to the lockstep controller.

9. The lockstep testing system of claim 8, wherein the comparator is further configured to generate third status data indicative of one or more bits associated with the second and third encoded data that are faulty, and provide the third status data to the lockstep controller, and wherein the lockstep controller is further configured to initiate a diagnosis of the first lockstep circuitry based on the third status data and the fault indication signal.

10. The lockstep testing system of claim 1, further comprising a fault management circuit that is coupled with the checker circuit, and configured to receive the fault indication signal and execute a recovery operation associated with the first lockstep circuitry.

11. The lockstep testing system of claim 1, wherein the plurality of functional circuits include first and second functional circuits that are operable in a lockstep mode, and configured to generate the first and second output data, respectively, and wherein the lockstep controller is further configured to generate a masking signal to facilitate masking of the first output data from the first functional circuit to a third functional circuit while the first lockstep circuitry is being tested.

12. The lockstep testing system of claim 1, wherein the fault injection circuit is further configured to receive the fault indication signal and update, based on the fault indication signal, the first and second fault data to facilitate the testing of the first lockstep circuitry in a continuous manner.

13. A lockstep testing system, comprising:
- a lockstep controller configured to generate a first control signal; and
- plurality of lockstep circuitries coupled with the lockstep controller, wherein first lockstep circuitry of the plurality of lockstep circuitries comprises:
  - a fault injection circuit that is coupled with the lockstep controller, and configured to receive the first control signal and first and second reference data, and generate first and second fault data;
  - a plurality of functional circuits that are coupled with the fault injection circuit, and configured to receive the first and second fault data and generate first and second output data; and
  - a checker circuit that is coupled with the plurality of functional circuits and the lockstep controller, and configured to receive the first and second output data, test whether the first lockstep circuitry is faulty, and generate and provide, to the lockstep controller, a fault indication signal that indicates whether the first lockstep circuitry is faulty.

14. The lockstep testing system of claim 13, wherein the first lockstep circuitry further comprises a first delay circuit that is configured to receive the first reference data and generate the second reference data such that the second reference data is a delayed version of the first reference data.

15. The lockstep testing system of claim 13, wherein the fault injection circuit comprises:
- an edge detector that is coupled with the lockstep controller, and configured to receive the first control signal and generate an edge signal, wherein the edge signal is indicative of one of positive and negative edges of the first control signal;
- a pulse generator that is coupled with the edge detector, and configured to receive the edge signal and a first clock signal, and generate a pulse signal; and
- first and second fault controllers that are configured to receive the first and second reference data, respectively, wherein the first and second fault controllers are coupled with the pulse generator, and further configured to receive the pulse signal, and wherein the first fault controller is further configured to generate the first fault data based on the first reference data and the pulse signal, and the second fault controller is further configured to generate the second fault data based on the second reference data and the pulse signal.

16. The lockstep testing system of claim 15, wherein the first lockstep circuitry further comprises a clock sweeping circuit that is coupled with first and second functional circuits of the plurality of functional circuits and the pulse generator, wherein the clock sweeping circuit is configured to receive the first reference data and a second clock signal, sweep the second clock signal with respect to the first reference data to generate the first clock signal, and provide the first clock signal to the first and second functional circuits and the pulse generator, and wherein the first and second functional circuits further generate the first and second output data, respectively, based on the first clock signal.

17. The lockstep testing system of claim 13, wherein the checker circuit comprises:
- a first encoder that is coupled with a first functional circuit of the plurality of functional circuits, and configured to receive the first output data and generate first encoded data;
- a second delay circuit that is coupled with the first encoder, and configured to receive the first encoded data and generate second encoded data such that the second encoded data is a delayed version of the first encoded data;
- a second encoder that is coupled with a second functional circuit of the plurality of functional circuits, and configured to receive the second output data and generate third encoded data; and
- a comparator that is coupled with the second delay circuit, the second encoder, and the lockstep controller, and configured to (i) receive the second and third encoded data from the second delay circuit and the second encoder, respectively, (ii) test whether the first lockstep circuitry is faulty by comparing the second and third encoded data, and (iii) generate and provide, based on a result of the comparison of the second and third encoded data, the fault indication signal to the lockstep controller, wherein the fault indication signal is deactivated when the second and third encoded data match, and activated when the second and third encoded data do not match.

18. A system-on-chip (SoC), comprising:
- a first functional circuit that is configured to generate first reference data; and
- a lockstep testing system coupled with the first functional circuit, the lockstep testing system comprising:

a lockstep controller configured to generate a first control signal; and plurality of lockstep circuitries coupled with the lockstep controller and the first functional circuit, wherein first lockstep circuitry of the plurality of lockstep circuitries comprises:

a plurality of functional circuits configured to receive the first reference data and second reference data, and generate first and second output data;

a fault injection circuit that is coupled with the lockstep controller and the plurality of functional circuits, and configured to receive the first control signal and the first and second output data, and generate first and second fault data; and a checker circuit that is coupled with the fault injection circuit and the lockstep controller, and configured to receive the first and second fault data, test whether the first lockstep circuitry is faulty, and generate and provide, to the lockstep controller, a fault indication signal that indicates whether the first lockstep circuitry is faulty.

19. The SoC of claim 18, wherein the fault injection circuit comprises:

an edge detector that is coupled with the lockstep controller, and configured to receive the first control signal and generate an edge signal, wherein the edge signal is indicative of one of positive and negative edges of the first control signal;

a pulse generator that is coupled with the edge detector, and configured to receive the edge signal and a first clock signal, and generate a pulse signal; and first and second fault controllers that are coupled with second and third functional circuits of the plurality of functional circuits, and configured to receive the first and second output data, respectively, wherein the first and second fault controllers are further coupled with the pulse generator, and further configured to receive the pulse signal, and wherein the first fault controller is further configured to generate the first fault data based on the first output data and the pulse signal, and the second fault controller is further configured to generate the second fault data based on the second output data and the pulse signal.

20. The SoC of claim 18, wherein the checker circuit comprises:

a first encoder that is coupled with the fault injection circuit, and configured to receive the first fault data and generate first encoded data;

a second delay circuit that is coupled with the first encoder, and configured to receive the first encoded data and generate second encoded data such that the second encoded data is a delayed version of the first encoded data;

a second encoder that is coupled with the fault injection circuit, and configured to receive the second fault data and generate third encoded data; and a comparator that is coupled with the second delay circuit, the second encoder, and the lockstep controller, and configured to (i) receive the second and third encoded data, (ii) test whether the first lockstep circuitry is faulty by comparing the second and third encoded data, (iii) generate the fault indication signal based on a result of the comparison of the second and third encoded data, and (iv) provide the fault indication signal to the lockstep controller, wherein the fault indication signal is deactivated when the second and third encoded data match, and activated when the second and third encoded data do not match.

* * * * *